(12) United States Patent
Chang et al.

(10) Patent No.: US 8,766,734 B2
(45) Date of Patent: Jul. 1, 2014

(54) THROUGH SILICON VIA-BASED OSCILLATOR WAFER-LEVEL-PACKAGE STRUCTURE AND METHOD FOR FABRICATING THE SAME

(75) Inventors: Chi-Chung Chang, Tao Yuan County (TW); Chih-Hung Chiu, Tao Yuan County (TW); Yen-Chi Chen, Tao Yuan County (TW); Kuan-Neng Chen, Hsinchu (TW); Jian-Yu Shih, Hsinchu (TW)

(73) Assignee: TXC Corporation, Taoyuan County (TW)

( * ) Notice: Subject to any disclaimer, the term of this patent is extended or adjusted under 35 U.S.C. 154(b) by 75 days.

(21) Appl. No.: 13/530,199

(22) Filed: Jun. 22, 2012

(65) Prior Publication Data
US 2013/0285754 A1    Oct. 31, 2013

(30) Foreign Application Priority Data
Apr. 27, 2012 (TW) .............................. 101115206 A (51) Int. Cl.
| H01L 21/44 | (2006.01) |
| H01L 21/48 | (2006.01) |
| H01L 21/50 | (2006.01) |
| H01L 23/52 | (2006.01) |
| H03B 1/00  | (2006.01) |

(52) U.S. Cl.
USPC ....... 331/108 C; 331/158; 257/774; 438/106; 438/108; 438/111; 438/613

(58) Field of Classification Search
USPC .................. 438/106, 108, 111, 613; 257/774; 331/108 C, 68
See application file for complete search history.

(56) References Cited

U.S. PATENT DOCUMENTS

| 5,030,857 A | 7/1991 | Sanwo et al. |
| 6,531,807 B2 | 3/2003 | Tanaka et al. |
| 6,545,392 B2 | 4/2003 | Kawauchi et al. |
| 6,929,974 B2 * | 8/2005 | Ding et al. .................... 438/106 |
| 7,098,580 B2 * | 8/2006 | Sasagawa et al. ............. 310/348 |
| 7,608,986 B2 | 10/2009 | Yong et al. |

* cited by examiner

*Primary Examiner* — Arnold Kinkead
(74) *Attorney, Agent, or Firm* — Rosenberg, Klein & Lee (57) ABSTRACT

The present invention provides a TSV-based oscillator WLP structure and a method for fabricating the same. The method of the present invention comprises steps: providing a silicon base having an oscillator unit disposed thereon; forming on the silicon base at least one package ring surrounding the oscillator unit; and disposing a silicon cap on the package ring to envelop the oscillator unit. The present invention adopts a cap and a base, which are made of the same material, to effectively overcome the problem of thermal stress occurring in a conventional sandwich package structure. Further, the present invention elaborately designs the wiring on the lower surface of the base to reduce the package size and decrease consumption of noble metals.

18 Claims, 10 Drawing Sheets

THROUGH SILICON VIA-BASED OSCILLATOR WAFER-LEVEL-PACKAGE STRUCTURE AND METHOD FOR FABRICATING THE SAME

BACKGROUND OF THE INVENTION

1. Field of the Invention

The present invention relates to an oscillator wafer-level-package (WLP) structure and a method for the same, particularly to a TSV-based oscillator WLP structure having cap and base made of an identical material and a method for fabricating the same.

2. Description of the Related Art

Featuring stable piezoelectricity, quartz elements can precisely provide functions of reference frequencies, clock control, timing, and noise filtering in a wide range. Besides, some quartz elements are used to sense movement and pressure, and some are used as optical elements. Therefore, quartz elements are indispensables for electronics.

Many prior arts have proposed a lot of schemes for packaging quartz oscillators. A U.S. Pat. No. 5,030,875 disclosed a "Sacrificial Quartz-Crystal Mount", which belongs to an early package technology using metal caps. The prior art has a complicated structure and is hard to reduce the package volume. A U.S. Pat. No. 6,545,392 disclosed a "Package Structure for a Piezoelectric Resonator", wherein a package structure for a piezoelectric resonator includes a base which has a shape of flat box and made of an insulating material, and a thin lid bonded to the upper side of the base. A tuning fork type quartz crystal resonator piece is mounted at its one end, that is its base end, on electrode pads provided on the mounting surface in a cantilever manner using conductive adhesive so that it is parallel to the mounting surface, and hermetically sealed in a package with the lid engaged therewith. Either one or both of the mounting surface of the base and the inner surface of the lid has a recess formed at the location adjacent to the free end of a tuning fork type quartz crystal resonator piece so that the free end does not touch the inside surfaces of the packages when the quartz crystal resonator piece is largely dislocated on external impact. However, the prior art is expensive and hard to reduce the package size.

A U.S. Pat. No. 6,531,807 disclosed a "Piezoelectric Device", wherein a package has a first region and a second region on one principal plane, and has a base including a ceramic board where wiring patterns to connect a quartz crystal resonator element and an IC chip for its driving are formed. In the base, a first sidewall enclosing the first region is arranged on the top side of the board, and the quartz crystal resonator element is mounted in a first void space delimited in its internal, and the IC chip is mounted in a second void space delimited by a second sidewall enclosing the second region. The first sidewall is formed to be higher than the second sidewall, a metal cover is seam welded at the upper end thereof, and the first void space is sealed in a vacuum or nitrogen atmosphere. The IC chip of the second region is resin sealed. In addition to the miniaturization, thinning and high-accuracy frequency adjustment, the present invention reduces or eliminates the stray capacity caused by the adsorption of gas that is generated from electronic components and wiring, package/wiring structure, and the like to reduce or prevent the reduction of variable amount of frequency and displays a high frequency stability and aging characteristics. It is particularly suited to a high-frequency oscillator with a large variable amount of frequency. Since the prior art arranges the resonator element and the IC chip in different regions and uses a ceramic base as the package substrate, it has a large area and a high fabrication cost.

A U.S. Pat. No. 7,098,580 disclosed a "Piezoelectric Oscillator", wherein a quartz-crystal oscillator has a configuration wherein a rectangular container accommodating a piezoelectric oscillator device therein is fixed to a rectangular supporting substrate on which an IC device is mounted via spacer members formed of metal bodies. On the surface of the supporting substrate, part or all of the IC device and side faces of the spacer members are coated with a resin material. When the quartz-crystal oscillator is implemented on a main board by soldering or the like, the problem that the solder for bonding the quartz-crystal oscillator to the main board is adhered to the spacer members, thereby causing a short-circuit can be effectively prevented. However, the prior art cannot effectively reduce the overall volume. Also, the prior art has a higher fabrication cost.

A U.S. Pat. No. 7,608,986 disclosed a "Quartz Crystal Resonator", wherein a quartz crystal resonator includes a quartz crystal resonator element having a main surface including an X axis (electrical axis) and a Z' axis of an inclination rotated at an angle (y) equal to or greater than 36.4 degrees and equal to or smaller than, 40.5 degrees from a Z axis (optical axis) around the X axis, a main vibrating portion vibrating at a predetermined resonance frequency (f) and a supporting portion integrally formed with the main vibrating portion in such a manner as to be formed peripherally to surround the main vibrating portion, and two covers having a thermal expansion coefficient equal to or greater than $6.\times 10.^{-6}$ per degrees centigrade and equal to or smaller than $10.\times 10.^{-6}$ per degrees centigrade and bonded to the supporting portion so as to sandwich the quartz crystal resonator element therebetween. The prior art forms a sandwich structure, wherein the substrate and the quartz crystal resonator element respectively have different thermal expansion coefficients. Temperature variation would induce thermal stress in the quartz crystal resonator element and causes deviation of the vibration frequency. Therefore, the prior art has to use a quartz chip cut at special angles and adopt a cap and a base respectively having special thermal expansion coefficients. Therefore, the prior art has a complicated fabrication process and a high fabrication cost.

All the abovementioned prior arts are beset by the plight of having to use ceramic substrates. Therefore, the products of the prior arts are expensive, and the raw materials thereof are likely to run out of stock. Further, the thermal stress of the sandwich structure is still hard to overcome at present.

Therefore, the manufacturers in the field are eager to develop a novel oscillator package structure to overcome the abovementioned problems.

SUMMARY OF THE INVENTION

The primary objective of the present invention is to provide a TSV (Through Silicon Via)-based oscillator WLP (Wafer Level Package) structure and a method for fabricating the same, which is exempted from using a ceramic substrate, whereby the present invention can effectively reduce the cost and has stable supply of raw materials, and whereby is overcome the conventional problem of thermal stress of a sandwich structure.

Another objective of the present invention is to provide a TSV-based oscillator WLP structure and a method for fabricating the same, wherein the vias are formed at the same side of a silicon base, whereby the oscillators on a wafer can be directly packaged, and whereby the oscillators can be mass produced.

A further objective of the present invention is to provide a TSV-based oscillator WLP structure and a method for fabricating the same, wherein the size of the oscillator package is reduced and the interconnection lines are shortened, whereby is decreased the consumption of noble metals, and whereby is reduced the effect of the high frequency-induced parasitic capacitance and inductance.

To realize the abovementioned objectives, the present invention proposes a TSV-based oscillator WLP structure, which comprises a silicon base, at least one package ring and a silicon cap, wherein an oscillator unit is arranged on the silicon base, and wherein the package ring is formed on the silicon base and surrounds the oscillator unit, and wherein the silicon cap is disposed on the package ring to envelop the oscillator unit.

The present invention also proposes a method for fabricating a TSV-based oscillator WLP structure, which comprises steps: providing a silicon base containing an oscillator unit; forming at least one package ring surrounding the oscillator unit on the silicon base; and disposing a silicon cap on the package ring to envelop the oscillator unit.

According to one embodiment, at least two metallic conductive pillars are formed in the silicon base and at the same side of the silicon base, penetrating the silicon base.

Below, embodiments are described in detail in cooperation with the attached drawings to make easily understood the objectives, technical contents, characteristics and accomplishments of the present invention.

DETAILED DESCRIPTION OF THE INVENTION

Figure 1:
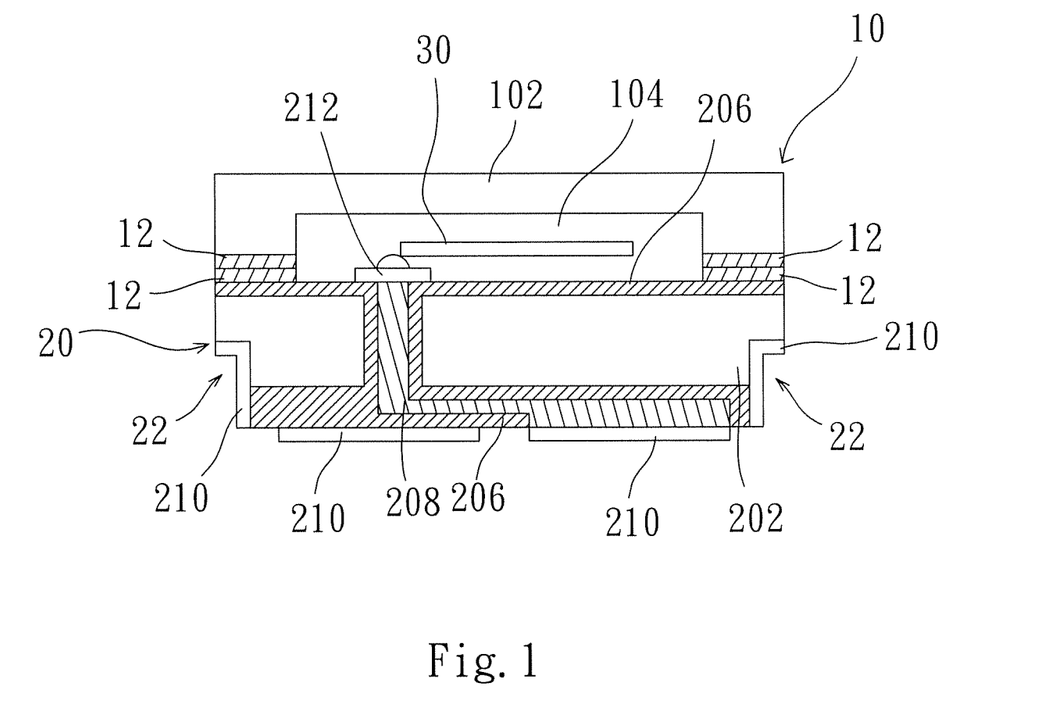
FIG. 1 is a sectional view schematically showing a TSV-based oscillator WLP structure according to one embodiment of the present invention.

Refer to FIG. 1, which is a sectional view schematically showing a TSV-based oscillator WLP structure according to one embodiment of the present invention.

In this embodiment, the TSV-based oscillator WLP structure comprises a silicon cap 10, a silicon base 20 and at least one package ring 12. An oscillator unit 30 is arranged on the silicon base 20. The oscillator unit 30 can be a quartz oscillator (such as temperature-stable AT-quart quartz oscillator or a tuning-fork quartz oscillator) or a mechanical-resonance oscillator.

In one embodiment, the upper and lower surfaces of the oscillator unit 30 respectively have upper and lower electrodes. The electrodes are electrically connected with metallic solder pads on the silicon base 20 via conductive bumps 212 to excite the oscillator unit 30.

In one embodiment, the conductive bump 212 is made of a material selected from a group consisting of gold, copper, tin, silver, indium, alloys of the aforementioned metals, or a conductive paste made of silver particles and resin. The oscillator unit 30 is disposed on the conductive bump 212 to electrically connect with a first metal layer 208 and a second metal layer 210 (they will be described in detail below), whereby the signals can be input to or output from the oscillator unit 30.

At least one package ring 12 is disposed on the silicon base 20 and surrounds the oscillator unit 30. The package ring 12 is made of a material selected from a group consisting of copper, tin, gold, silver, indium, alloys of the aforementioned metals, polymers, or oxides. The silicon cap 10 is disposed on the package ring 12 to envelop the oscillator unit 30. Thereby, the present invention uses the silicon cap 10, the silicon base 20, and the package ring 12 to realize an airtight package of the oscillator unit 30. The airtight space may be vacuum or filled with helium. Further, the present invention adopts a silicon cap 10 and a silicon base 20, which are made of the same material, to prevent from thermal stress in airtight enveloping.

In the embodiment shown in FIG. 1, the silicon cap 10 includes a first silicon wafer 102 and a cavity 104. The cavity 104 is formed on the lower surface of the first silicon wafer 102, accommodating the oscillator unit 30.

In one embodiment, another package ring 12 is formed on the lower surface of the silicon cap 10, and the package ring 12 of the silicon cap 10 is joined to the package ring 12 of the silicon base 20 to enhance airtightness.

Figure 2:
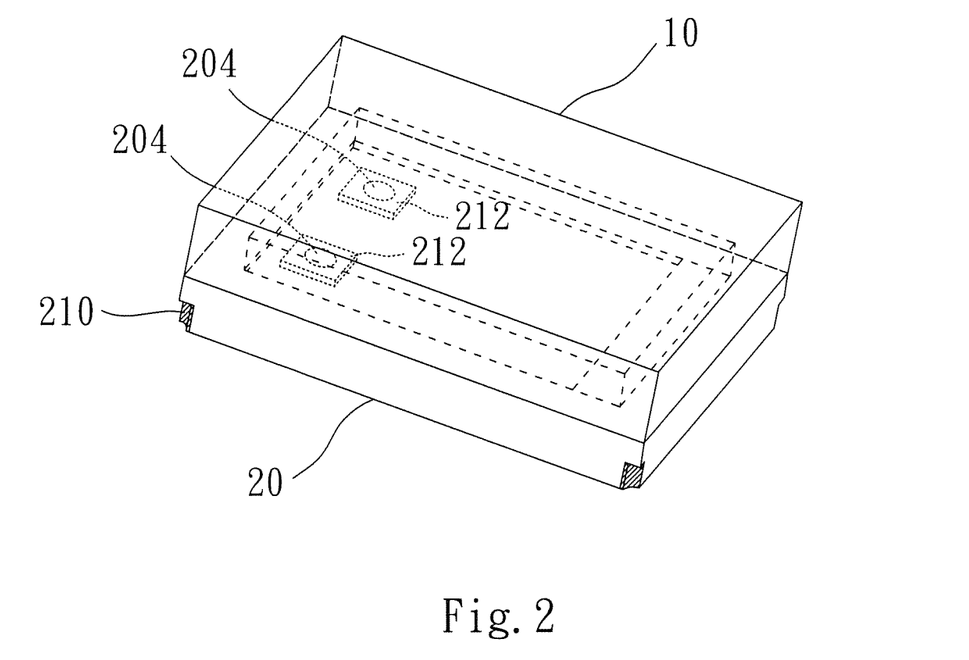
FIG. 2 is a perspective view schematically showing a TSV-based oscillator WLP structure according to one embodiment of the present invention.

Refer to FIG. 2, which is a perspective view schematically showing a TSV-based oscillator WLP structure according to one embodiment of the present invention. The structural features of the silicon base 20 will be described in detail in cooperation with FIG. 2 below.

As shown in FIG. 1 and FIG. 2, the silicon base 20 includes a second silicon wafer 202, at least two vias 204, an oxide layer 206, a first metal layer 208 and a second metal layer 210. In FIG. 2, a single via 204 is used for explaining the wiring design of the present invention. However, it should be noted that the present invention does not constrain that there is only one via 204 in the silicon base 20.

The present invention elaborately designs the first metal layer 208 and the second metal layer 210 to exempt the two vias 204 from being arranged diagonally. As shown in FIG. 2, the present invention provides the two vias 204, being formed at the same side of the second silicon wafer 202.

In one embodiment, the vias 204 penetrate the second silicon wafer 202. The bumps 212 are formed over the vias 204. The oxide layer 206 is formed on the upper and lower surface of the second silicon wafer 202 and the inner surfaces of the vias 204. The first metal layer 208 is formed on the oxide layer 205 and filled into the vias 204 to form metallic conductive pillars. In one embodiment, the metallic conductive pillars are fabricated with a TSV (Through Silicon Via) technology.

Then, the first metal layer 208 is extended toward the lower surface of the second silicon wafer 202 and electrically connected with the second metal layer 210 on the lower surface of the second silicon wafer 202. Therefore, the signals are input into or output from the oscillator unit 30 through the bumps 212 electrically connected with the oscillator unit 30, the first metal layer 208 filled into the vias 204, and the second metal layer 210 connected to the first metal layer 208.

The present invention exempts the two vias 204 from being arranged diagonally and allows the two vias 204 to be formed at the same side of the second silicon wafer 202 via designing the wiring of the first metal layer 208 and the second metal layer 210 to run on the lower surface of the second silicon wafer 202. Thereby, the fabrication cost is greatly reduced, and the fabrication process is effectively simplified.

In one embodiment, the first metal layer 208 can be made of copper, and the second metal layer 210 can be made of gold.

Additionally, at least two notches 22 are formed on the lower surface of the second silicon wafer 202. The second metal layer 210 is simultaneously overlaid on the lower surface of the second silicon wafer 202 and the notches 22. As shown in FIG. 1, the second metal layer 210 overlaid on the lower surface of the second silicon wafer 202 is disconnected from the second metal layer 210 overlaid on the notches 22 so as to effectively inhibit short circuit in the package structure. Further, the notches 22 have a special structure, which can be used to hold solder in the succeeding process.

Figure 3:
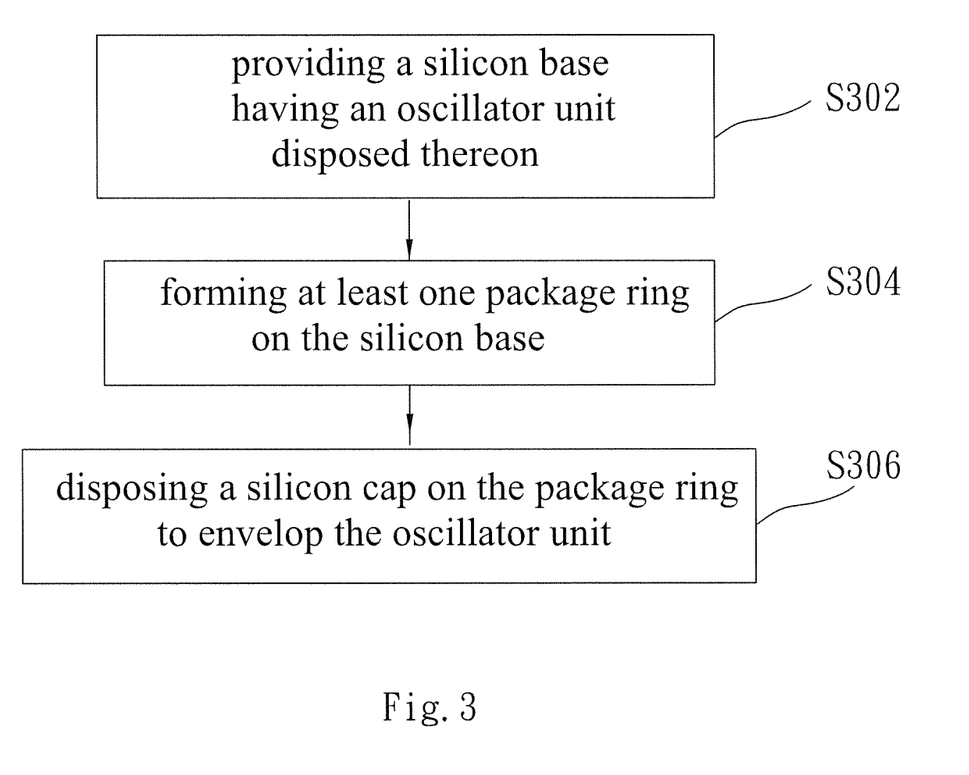
FIG. 3 shows a flowchart of a method for fabricating a TSV-based oscillator WLP structure according to one embodiment of the present invention.

Refer to FIG. 3 showing a flowchart of a method for fabricating a TSV-based oscillator WLP structure according to one embodiment of the present invention. The method of the present invention comprises Step S302, Step S304, and Step S306. Refer to FIG. 1 and FIG. 2 also when the method of the present invention is described in detail below.

In Step S302, the present invention provides a silicon base 20 having an oscillator unit 30. In Step S304, form at least one package ring 12 surrounding the oscillator unit 30 on the silicon base 20. In Step S306, dispose a silicon cap 10 on the package ring 12 to envelop the oscillator unit 30.

The types of the oscillator unit 30 and the materials of the package ring 12 are the same as mentioned before and will not be repeated herein.

Below, the processes to fabricate the silicon base 20 and the silicon cap 10 will be described in detail.

Figure 4A:
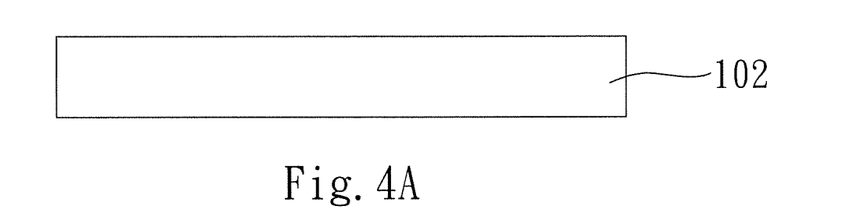
FIGS. 4A-4C are sectional views schematically showing the process to fabricate a silicon cap according to a first embodiment of the present invention.
Figure 4B:
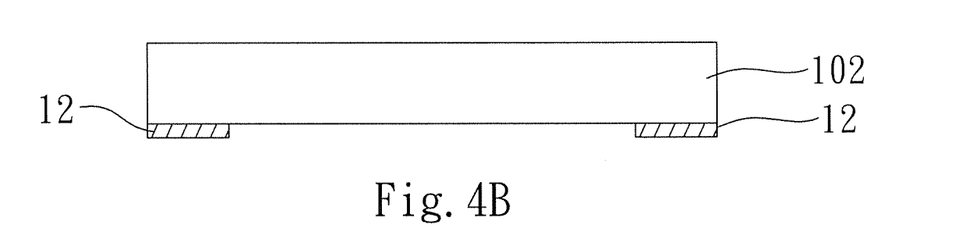
Figure 4C:
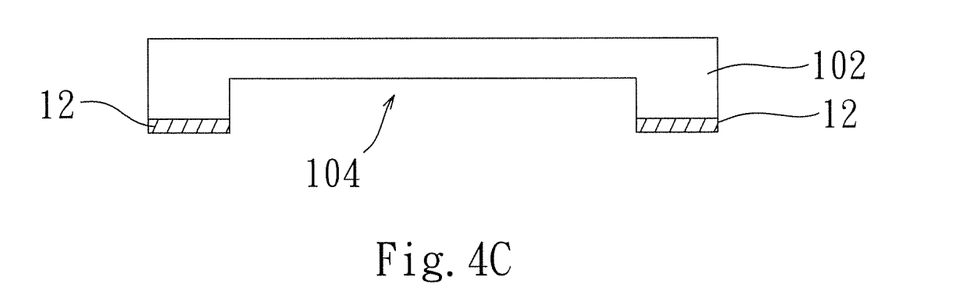

Refer to FIGS. 4A-4C, which are sectional views schematically showing the process to fabricate the silicon cap according to a first embodiment of the present invention.

Firstly, the present invention provides a first silicon wafer 102. Next, form at least one package ring 12 on the lower surface of the first silicon wafer 102. Next, etch the first silicon wafer 102 to form in the first silicon wafer 102 a cavity 102 accommodating an oscillator unit 30. In one embodiment, the etching process may be realized with an ICP (Inductively Coupled Plasma) etching technology, an RIE (Reactive Ion Etching) technology, or a wet etching technology.

In this embodiment, the package ring 12 is formed on the lower surface of the first silicon wafer 102 to achieve the objective of increasing the airtightness of the oscillator unit 30. In other embodiments of the present invention, the package ring 12 may be alternatively formed on the silicon base 20 to achieve the same objective.

Figure 4D:
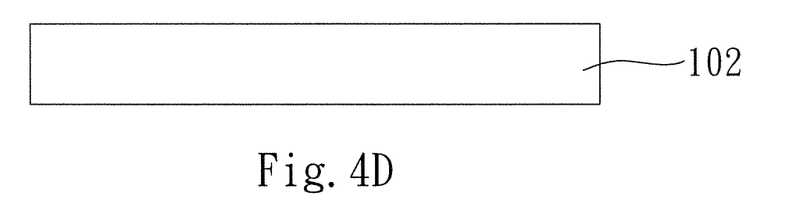
FIGS. 4D-4F are sectional views schematically showing the process to fabricate a silicon cap according to a second embodiment of the present invention.
Figure 4E:
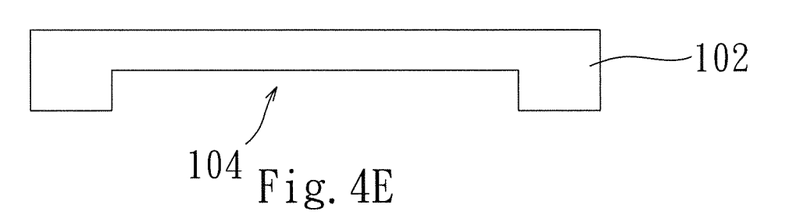
Figure 4F:
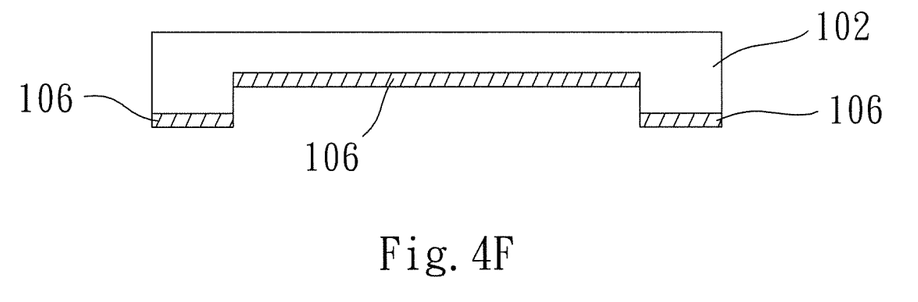

Refer to FIGS. 4D-4F, which are sectional views schematically showing the process to fabricate the silicon cap according to a second embodiment of the present invention. In this embodiment, the silicon cap 10 is fabricated with an alternative method.

Firstly, the present invention provides a first silicon wafer 102. Next, etch the lower surface of the first silicon wafer 102 to form a cavity 104 on the lower surface of the first silicon wafer 102. Next, electroplate a metal barrier layer 106 on the cavity 104, as shown in FIG. 4F.

In this embodiment, the present invention uses the electroplated metal barrier layer 106 as the package material (i.e. the package ring) in the succeeding package process. Thereby are saved some conventional process steps. Therefore, the silicon cap 10 can be realized with either of the two aforementioned embodiments.

Refer to FIGS. 5A-5J, which are sectional views schematically showing the process to fabricate the silicon base according to one embodiment of the present invention.

Figure 5A:
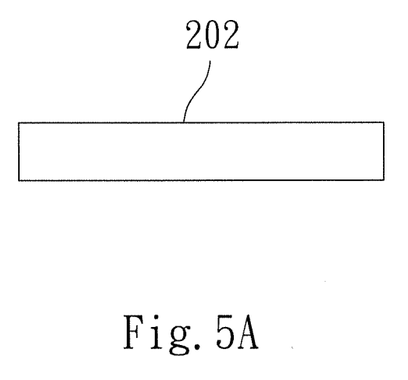
FIGS. 5A-5J are sectional views schematically showing the process to fabricate a silicon base according to one embodiment of the present invention.
Figure 5B:
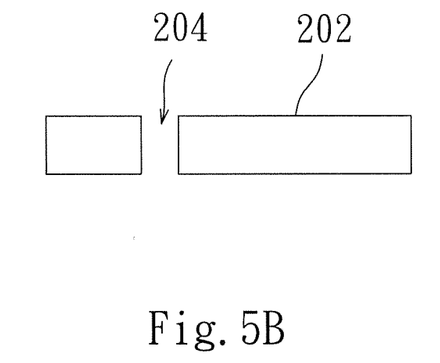

Firstly, the present invention provides a second silicon wafer 202, and forms at least two vias 204 penetrating the second silicon wafer 202. As mentioned before, a single via 204 is only used in the exemplification of the wiring design of the present invention, but the present invention is not limited thereto.

As shown in FIG. 2, the two vias 204 are formed at the same side of the second silicon wafer 202 of the silicon base 20. The present invention elaborately designs the first metal layer 208 and the second metal layer 210 to exempt the two vias 204 from being arranged diagonally and allow the vias 204 to be formed at the side of the silicon base 20.

Figure 5C:
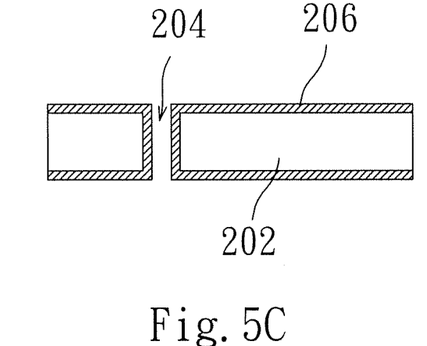
Figure 5D:
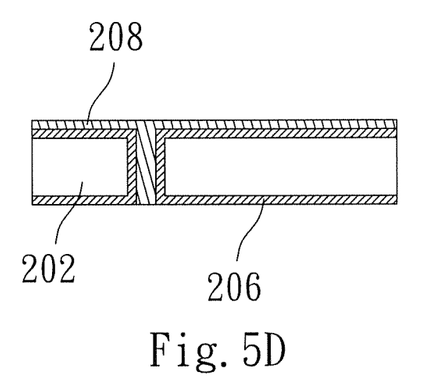
Figure 5E:
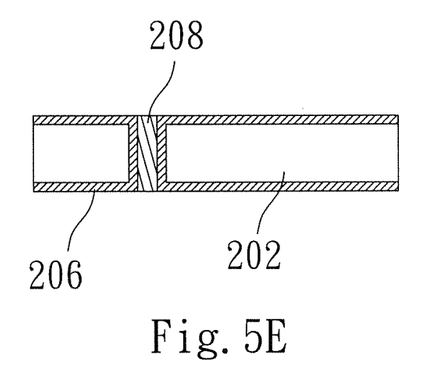

Next, as shown in FIG. 5C, the present invention forms an oxide layer 206 on the upper and lower surfaces of the second silicon wafer 202 and the inner surfaces of the vias 204.

Next, as shown in FIGS. 5D-5G, the present invention electroplates a first metal layer 208 on the oxide layer 206, and remove the first metal layer 208 disposed on the upper surface of the second silicon wafer 202. Therefore, the first metal layer 208 only fills in the vias 204 so as to form the metallic conductive pillars 208.

Figure 5F:
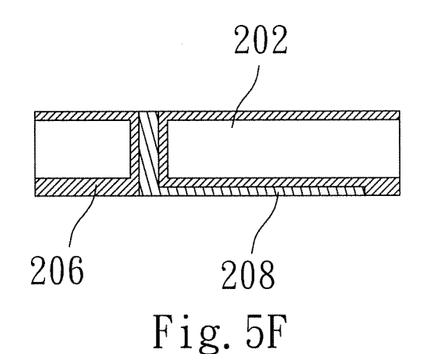
Figure 5G:
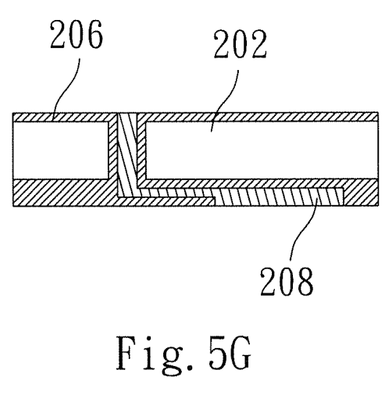

Next, as shown in FIG. 5F and FIG. 5G, the first metal layer 208 is patterned to extend toward the lower surface of the second silicon wafer 202.

Figure 5H:
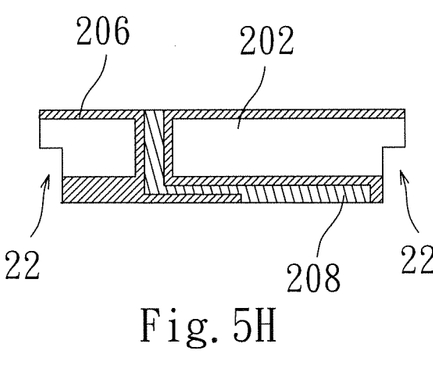

Next, as shown in FIG. 5H, the present invention etches the second silicon wafer 202 to form at least two notches 22 on the lower surface of the second silicon wafer 202. The etching process may be realized with an ICP etching technology, an RIE technology, or a wet etching technology.

Figure 5I:
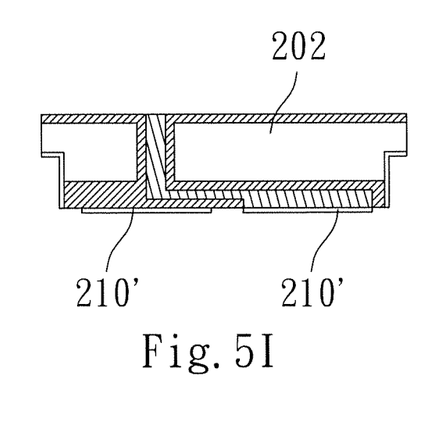
Figure 5J:
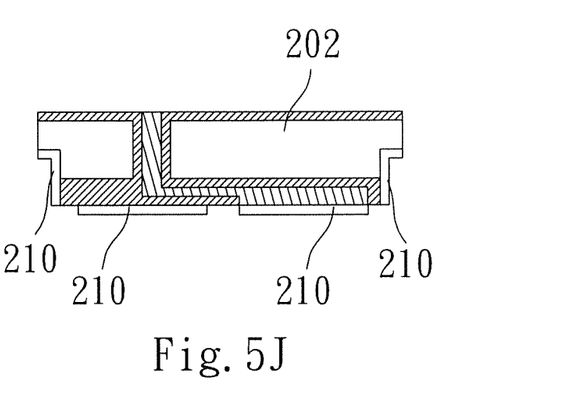

Next, as shown in FIG. 5I and FIG. 5J, the present invention electroplates a seed layer 210' on the lower surface of the second silicon wafer 202, and then electroplate a second metal layer 210 on the seed layer 210'. The second metal layer 210 is simultaneously overlaid on the lower surface of the second silicon wafer 202 and the notches 22. It should be noted that the second metal layer 210 overlaid on the lower surface of the second silicon wafer 202 is disconnected from the second metal layer 210 overlaid on the notches 22 to prevent a short circuit from occurring in the package structure.

In one embodiment, for example, the first metal layer 208 can be made of copper, and the second metal layer 210 can be made of gold. The second metal layer 210 overlaid on the lower surface of the second silicon wafer 202 is electrically connected with the first metal layer 208. Thus is completed Step S302 and formed the silicon base 20.

Figure 5K:
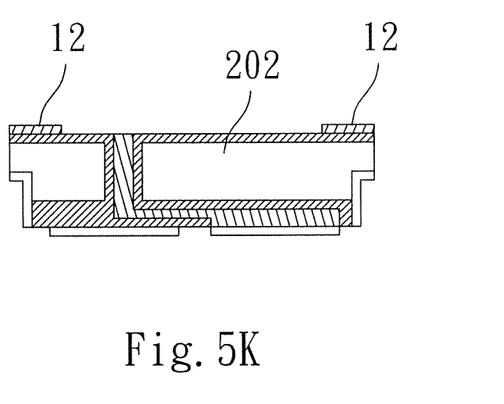
FIG. 5K is a sectional view schematically showing that a package ring is formed on a silicon base according to one embodiment of the present invention.

Next, as shown in FIG. 5K, a package ring 12 is formed on the silicon base 20 (Step S304), for airtightly enveloping the oscillator unit 30.

Figure 5L:
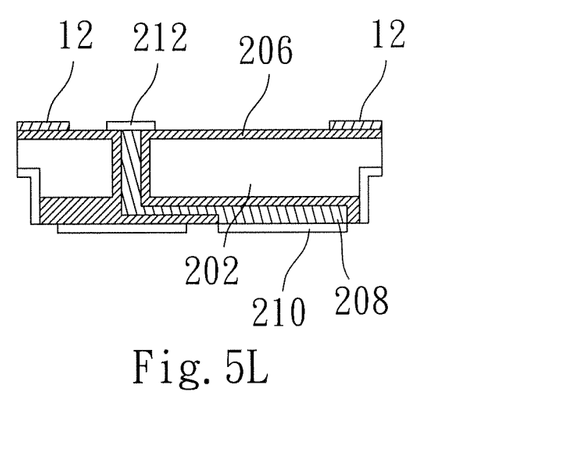
FIG. 5L is a sectional view schematically showing that a bump is formed on a metal conductive pillar according to one embodiment of the present invention.

Furthermore, as shown in FIG. 5L, the bumps 212 are formed on the metallic conductive pillars 208 (refer to the vias 204 in FIG. 5B) for functioning as recognition marks for dispensing glue.

In embodiments of the present invention, the oscillator unit 30 is disposed on the conductive bump 212, and the conductive bump 212 is made of a conductive material. Therefore, the oscillator unit 30 can electrically connect with the external circuit through the via 204 filled with the first metal layer 208 (i.e. the metallic conductive pillar), the first metal layer 208 and the second metal layer 210 for receiving or outputting signals.

Figure 6:
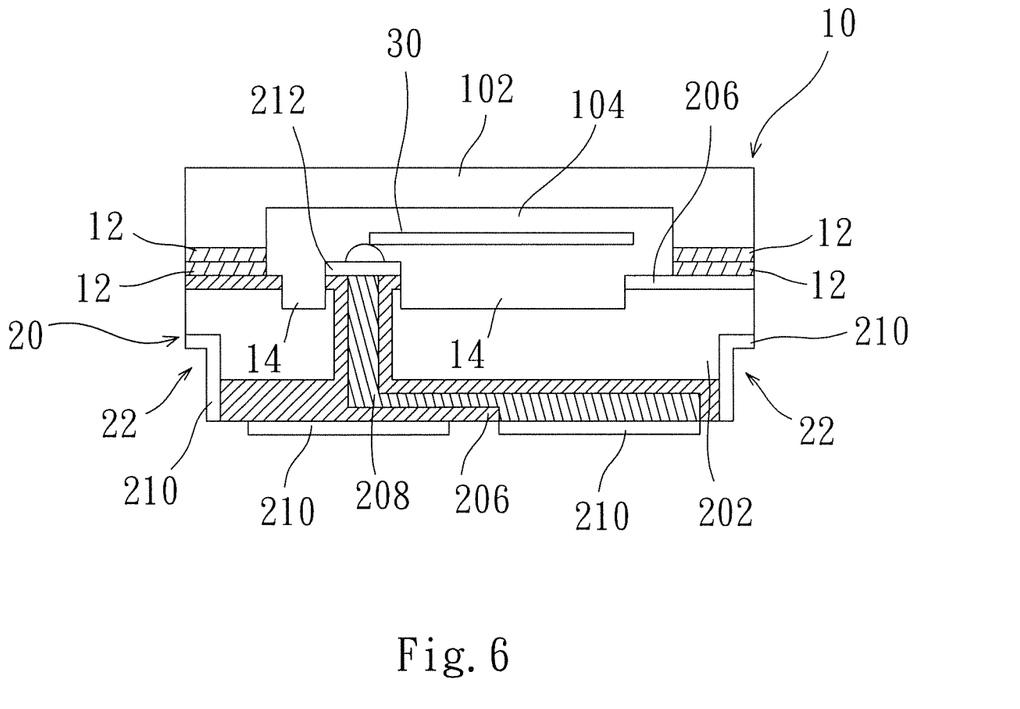
FIG. 6 is a sectional view schematically showing a TSV-based oscillator WLP structure having two basins according to one embodiment of the present invention.

In one embodiment, at least one basin 14 is formed in the silicon base 20. As shown in FIG. 6, the basins 14 are respectively formed (1) between the package ring 12 and the conductive bump 212, and (2) below the oscillator unit 30. When the package ring is heated into a melt, the melt is guided to the basins 14 such that it does not contact the conductive bump 212 and cause short circuit. Thus, the oscillator package can escape from a permanent failure caused by short circuit.

Further, when the oscillator unit 30 is inclined, the basin 14 below the oscillator unit 30 can increase the accommodation space for the oscillator unit 30 such that the inclined oscillator unit 30 does not contact the silicon base 20.

Figure 7:
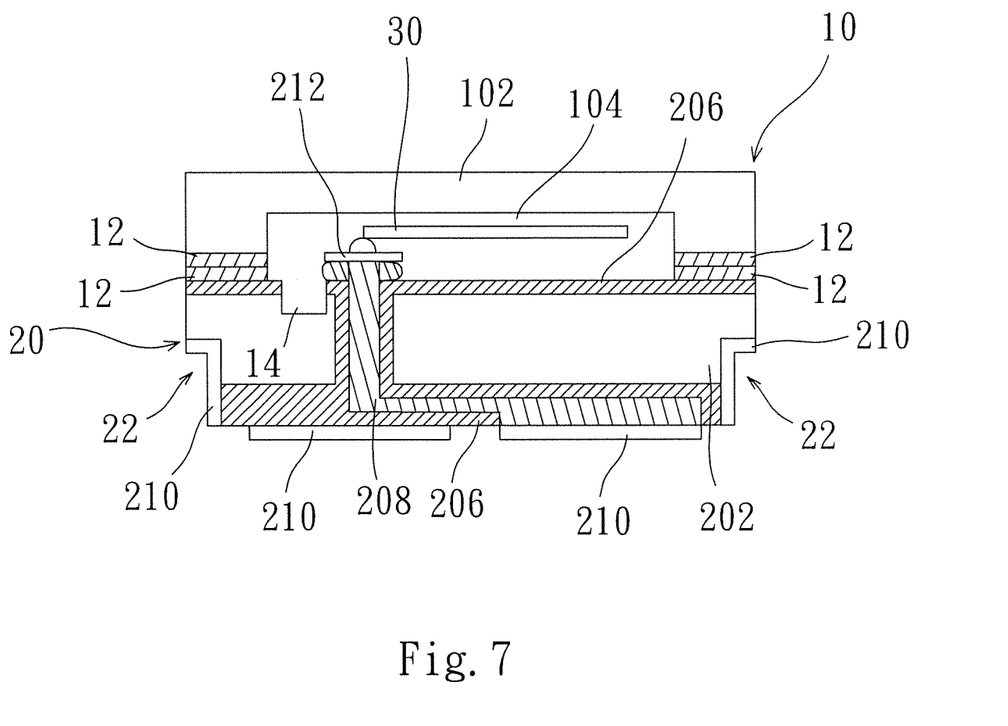
FIG. 7 is a sectional view schematically showing a TSV-based oscillator WLP structure having a single basin according to one embodiment of the present invention.

Refer to FIG. 7, which is a sectional view schematically showing a TSV-based oscillator WLP structure according to another embodiment of the present invention. In this embodiment, the basin 14 is only formed between the package ring 12 and the conductive bump 212. In this embodiment, the conductive bump 212 and the metallic conductive pillar 208 are deposited to a level higher than that in FIG. 6. In such a case, there is naturally a greater distance between the oscillator unit 30 and the silicon base 20, which is sufficient to buffer the inclined oscillator unit 30.

Figure 8:
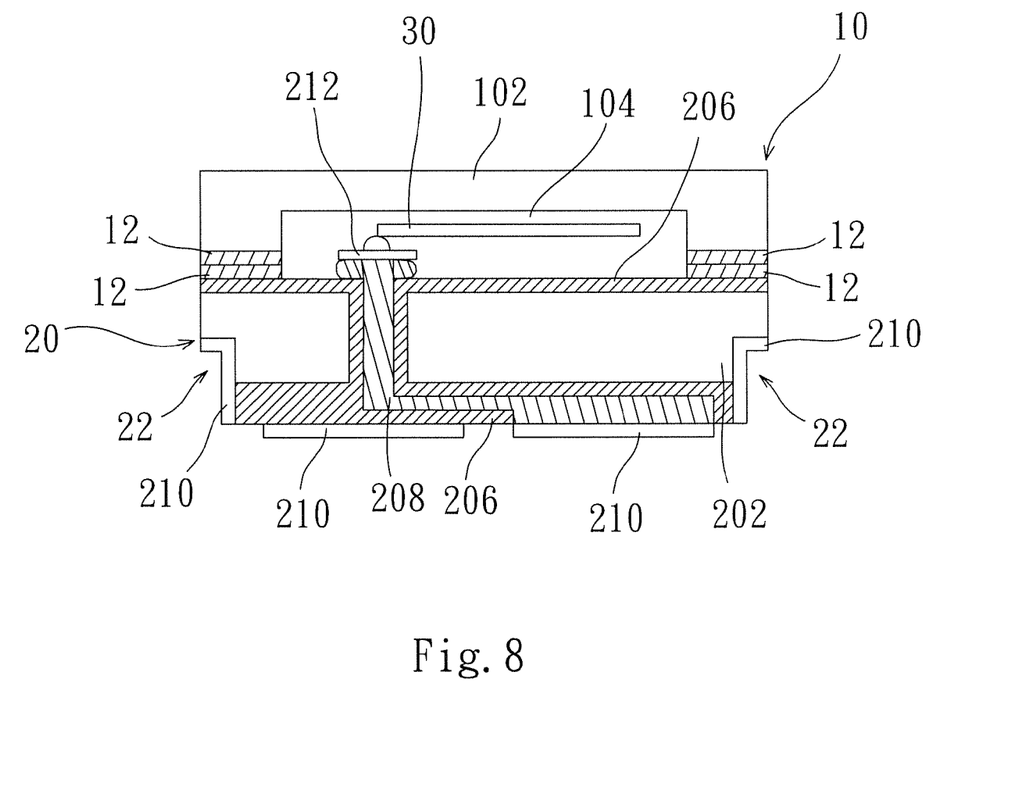
FIG. 8 is a sectional view schematically showing a TSV-based oscillator WLP structure free of basins according to one embodiment of the present invention.

Refer to FIG. 8, which is a sectional view schematically showing a TSV-based oscillator WLP structure according to yet another embodiment of the present invention. In this embodiment, no basin 14 is formed between the package ring 12 and the conductive bump 212. In this embodiment, the conductive bump 212 and the metallic conductive pillar 208 is also deposited to a level higher than that in FIG. 6, whereby the melted package ring 12 would not contact the conductive bump 212 either. Thus, this embodiment can also achieve the objective of the present invention.

In conclusion, the present invention discloses a TSV-based oscillator WLP structure and a method for fabricating the same, wherein the vias vertically penetrating the base are used to electrically connect the oscillator unit with the metal layers below the base. Thereby, the present invention is exempted from the problems caused by using ceramic bases, such as the problems of high fabrication cost and unstable supply of raw materials. Further, the present invention adopts a cap and a base, which are made of the same material, to overcome the problem of thermal stress of a sandwich package structure.

Furthermore, the present invention disposes the first and second metal layers on the bottom of the base, exempting the vias from being arranged diagonally and allowing the vias to be arranged at the same side of the base. Therefore, the present invention can decrease the product size, shorten interconnection lines and reduce the high frequency-induced parasitic capacitor/inductor effect.

The embodiments are described above to demonstrate the technical thought and characteristics of the present invention and enable the persons skilled in the art to understand, make, and use the present invention. However, those embodiments are only to exemplify the present invention but not to limit the scope of the present invention. Any equivalent modification or variation according to the spirit of the present invention is to be also included within the scope of the present invention.

What is claimed is:

1. A method for fabricating a through silicon via-based oscillator wafer-level-package structure, comprising steps:
    providing a silicon base having an oscillator unit disposed thereon, wherein said silicon base is fabricated with a process including steps:
        providing a second silicon wafer, and forming in said second silicon wafer at least two vias penetrating said second silicon wafer;
        forming an oxide layer on an upper surface and a lower surface of said second silicon wafer and on inner surfaces of said vias;
        electroplating a first metal layer on said oxide layer, wherein said first metal layer is filled into said vias to form at least two metallic conductive pillars, and wherein said first metal layer is extended toward said lower surface of said second silicon wafer; and
        electroplating a second metal layer on said lower surface of said second silicon wafer, wherein said second metal layer is electrically connected with said first metal layer, and wherein said oscillator unit is electrically connected with said metallic conductive pillars to receive or output signals through said first metal layer and said second metal layer;
    forming on said silicon base at least one package ring surrounding said oscillator unit; and
    disposing a silicon cap on said package ring to envelop said oscillator unit.

2. The method for fabricating a through silicon via-based oscillator wafer-level-package structure according to claim 1, wherein said silicon cap is fabricated with a process including steps:
    providing a first silicon wafer; and
    etching said first silicon wafer to form in said first silicon wafer a cavity accommodating said oscillator unit.

3. The method for fabricating a through silicon via-based oscillator wafer-level-package structure according to claim 2, wherein said process to fabricate said silicon cap further includes a step before etching said first silicon wafer:
    forming on a lower surface of said first silicon wafer at least one package ring to be joined with said at least one package ring of said silicon base for enveloping said oscillator unit.

4. The method for fabricating a through silicon via-based oscillator wafer-level-package structure according to claim 1, wherein said process to fabricate said silicon base further includes a step after electroplating said first metal layer on said oxide layer:
    removing said first metal layer on said upper surface of said second silicon wafer to let said first metal layer filled into said vias only and extended toward said lower surface of said second silicon wafer.

5. The method for fabricating a through silicon via-based oscillator wafer-level-package structure according to claim 1, wherein said process to fabricate said silicon base further includes a step before electroplating said second metal layer on said lower surface of said second silicon wafer:

electroplating on said lower surface of said second silicon wafer a seed layer where said second metal layer is to be electroplated.

6. The method for fabricating a through silicon via-based oscillator wafer-level-package structure according to claim 1, wherein said process to fabricate said silicon base further includes a step before electroplating said second metal layer on said lower surface of said second silicon wafer:
etching said second silicon layer to form at least two notches on said lower surface of said second silicon wafer.

7. The method for fabricating a through silicon via-based oscillator wafer-level-package structure according to claim 6, wherein said second metal layer is overlaid on said lower surface of said second silicon wafer and said notches, and wherein said second metal layer overlaid on said lower surface of said second silicon wafer is disconnected from said second metal surface overlaid on said notches.

8. The method for fabricating a through silicon via-based oscillator wafer-level-package structure according to claim 1, wherein said process to fabricate said silicon base further includes a step:
forming on said metallic conductive pillars at least two bumps functioning as recognition marks for dispensing glue, wherein said bumps are made of a conductive material, and said oscillator unit is disposed on said bumps to electrically connect with said metallic conductive pillars.

9. A through silicon via-based oscillator wafer-level-package structure comprising
a silicon base having an oscillator unit disposed thereon, wherein said silicon base includes:
a second silicon wafer;
at least two vias formed in said second silicon wafer and penetrating said second silicon wafer;
an oxide layer formed on an upper surface and a lower surface of said second silicon wafer and inner surfaces of said vias;
a first metal layer formed on said oxide layer, filled into said vias to form at least two metallic conductive pillars, and extended toward said lower surface of sais second silicon wafer; and
a second metal layer formed on said lower surface of said second silicon wafer and electrically connected with said first metal layer,
wherein said oscillator unit is electrically connected with said metallic conductive pillars to receive and output signals through said first metal layer and said second metal layer;
at least one package ring arranged on said silicon base and surrounding said oscillator unit; and
a silicon cap disposed on said at least one package ring to envelop said oscillator unit.

10. The through silicon via-based oscillator wafer-level-package structure according to claim 9, wherein said silicon cap includes a first silicon wafer and a cavity, and wherein said cavity is formed on a lower surface of said first silicon wafer and used to accommodate said oscillator unit.

11. The through silicon via-based oscillator wafer-level-package structure according to claim 9, wherein at least one package ring is disposed on a lower surface of said silicon cap and joined with said at least one package ring of said silicon base to envelop said oscillator unit.

12. The through silicon via-based oscillator wafer-level-package structure according to claim 9, wherein at least two notches are formed on said lower surface of said second silicon wafer, and wherein said second metal layer is overlaid on said lower surface of said second silicon wafer and said notches, and wherein said second metal layer overlaid on said lower surface of said second silicon wafer is disconnected from said second metal surface overlaid on said notches.

13. The through silicon via-based oscillator wafer-level-package structure according to claim 9, wherein said silicon base further includes at least two bumps formed on said metallic conductive pillars and made of a conductive material, and wherein said oscillator unit is disposed on said bumps to electrically connect with said metallic conductive pillars.

14. The through silicon via-based oscillator wafer-level-package structure according to claim 9, wherein said first metal layer is made of copper, and wherein said second metal layer is made of gold.

15. The through silicon via-based oscillator wafer-level-package structure according to claim 9, wherein said oscillator unit is a temperature-stable AT-cut quartz oscillator, a tuning-fork quartz oscillator, or a mechanical resonator.

16. The through silicon via-based oscillator wafer-level-package structure according to claim 9, wherein said package ring is made of a material selected from a group consisting of copper, tin, gold, silver, indium, alloys of aforementioned metals, polymers, or oxides.

17. The through silicon via-based oscillator wafer-level-package structure according to claim 9, wherein said vias are arranged at the same side of said second silicon wafer.

18. The through silicon via-based oscillator wafer-level-package structure according to claim 13, wherein at least one basin is formed on a surface of said silicon base, and wherein said at least one basin is arranged between said at least one package ring and said bumps, or arranged below said oscillator unit.

* * * * *